United States Patent
Lin et al.

(10) Patent No.: US 9,236,438 B2
(45) Date of Patent: Jan. 12, 2016

(54) SEMICONDUCTOR DEVICE

(71) Applicant: Delta Electronics, Inc., Taoyuan (TW)

(72) Inventors: Li-Fan Lin, Taoyuan (TW); Hsuan-Wen Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 14/707,810

(22) Filed: May 8, 2015

(65) Prior Publication Data

US 2015/0243744 A1 Aug. 27, 2015

Related U.S. Application Data

(63) Continuation of application No. 14/165,988, filed on Jan. 28, 2014.

(51) Int. Cl.
*H01L 29/417* (2006.01)
*H01L 29/423* (2006.01)
*H01L 27/088* (2006.01)
*H01L 29/78* (2006.01)
*H01L 29/778* (2006.01)
*H01L 29/06* (2006.01)
*H01L 29/20* (2006.01)

(52) U.S. Cl.
CPC ........ *H01L 29/41758* (2013.01); *H01L 27/088* (2013.01); *H01L 29/0696* (2013.01); *H01L 29/2003* (2013.01); *H01L 29/41775* (2013.01); *H01L 29/4238* (2013.01); *H01L 29/7783* (2013.01); *H01L 29/7787* (2013.01); *H01L 29/78* (2013.01)

(58) Field of Classification Search
CPC ................ H01L 29/2003; H01L 29/78; H01L 29/41758
USPC ...................... 257/459, 503, E23.015, E23.02
See application file for complete search history.

(56) References Cited

U.S. PATENT DOCUMENTS

| | | | |
|---|---|---|---|
| 5,847,413 A | 12/1998 | Yamazaki et al. | |
| 2009/0250730 A1 | 10/2009 | Kawasaki | |
| 2012/0056203 A1* | 3/2012 | Fujikawa et al. | 257/77 |
| 2012/0074534 A1 | 3/2012 | Lin et al. | |
| 2013/0207101 A1* | 8/2013 | Yamazaki et al. | 257/43 |

* cited by examiner

*Primary Examiner* — Kyoung Lee
*Assistant Examiner* — Ratisha Mehta
(74) *Attorney, Agent, or Firm* — Muncy, Geissler, Olds & Lowe P.C.

(57) ABSTRACT

A semiconductor device includes a substrate and a plurality of transistors arranged on the substrate in an array. The transistor includes a first electrode, a plurality of second electrodes, and a gate electrode. The second electrodes are arranged around the first electrode. The gate electrode is located between the first electrode and the second electrodes. The first electrode is a polygon. The gate electrode is around the first electrode, and an edge of the gate electrode facing the first electrode has a shape corresponding to that of the first electrode. The first electrode and the edge of the gate electrode facing the first electrode are regular polygons, and have the same center.

5 Claims, 12 Drawing Sheets

SEMICONDUCTOR DEVICE

CROSS-REFERENCE TO RELATED APPLICATIONS

The present application is a divisional application of pending U.S. patent application Ser. No. 14/165,988, filed on Jan. 28, 2014, which claims priority of Taiwan Patent Application No. 102135485, filed on Sep. 30, 2013, the entirety of which is incorporated by reference herein.

BACKGROUND OF THE INVENTION

1. Field of the Invention

The present disclosure relates to a semiconductor device and, in particular, to a semiconductor device having transistors.

2. Description of the Related Art

For improving switching speed, conventional power supplies utilize field-effect transistors as switching devices. Further, field-effect transistors have lower resistance, and thus power efficiency is improved.

As shown in FIG. 1, conventional field-effect transistors A10 are arranged on a substrate A20. The field-effect transistors A10 are connected with each other in parallel to output greater current. Each of the field-effect transistors A10 includes a drain electrode A11, a source electrode A12, and a gate electrode A13. The drain electrode A11, the source electrode A12, and the gate electrode A13 are linear in structure and parallel to each other.

When the field-effect transistors A10 are installed in a high-voltage power supply with a voltage higher than 300V, the distance between the drain electrode A11 and the source electrode A12 is greater than 7 nm. However, in this structure, the sum of the gate width Wg of the gate electrode A13 on the substrate A20 is short, and the current outputting by the field-effect transistors A10 is smaller.

For increasing the gate width Wg, as shown in FIG. 2, the drain electrodes A21 and the source electrodes A22 of the field-effect transistors A20 are alternately arranged in an array. The drain electrodes A21 and the source electrodes A22 are squares, and the gate electrodes A23 are elongated rectangles around the source electrodes A22. However, since electrons flow along a shortest path in general, the electrons may not flow through the invalid areas Z1 in FIG. 2. Therefore, some areas in the substrate A20 are wasted. A greater area of the substrate A20 is needed to output the same current with the same numbers as the field-effect transistors A20, and as a result, manufacturing cost is increased.

BRIEF SUMMARY OF THE INVENTION

To solve the described problems, the present disclosure provides a semiconductor device having a greater gate width of the gate electrode in the same area of the substrate, and providing greater current.

The present disclosure provides a semiconductor device including a substrate and a plurality of transistors. The transistors are arranged on the substrate in an array. Each of the transistors includes an active layer, a first electrode, a plurality of second electrodes and a gate electrode. The active layer is disposed on the substrate. The first electrode is disposed on the active layer. The second electrodes are disposed on the active layer, and annularly arranged on the first electrode. The gate electrode is disposed on the active layer and located between the first electrode and the second electrode. Moreover, the first electrode is a circle or polygon. The polygon is at least pentagon. A ratio of the shortest side to the longest side of the first electrode exceeds 0.7. The gate electrode is around the first electrode, and an edge of the gate electrode facing the first electrode has a shape corresponding to that of the first electrode. The first electrode and the edge of the gate electrode facing the first electrode are regular polygons, and have the same center.

The present disclosure also provides a semiconductor device including a substrate, an active layer, a protective layer, a plurality of drain electrodes, a gate electrode, and a plurality of source electrodes. The active layer is disposed on the substrate. The protective layer is disposed on the active layer. The protective layer has a plurality of first openings, a plurality of second openings, and a plurality of third openings. Each of the first openings is a circle or polygon, and the polygon is at least pentagonal. Each of the second openings is around one of the first openings, an edge of each of the second openings facing the first opening therein has a shape corresponding to that of the first opening. The third openings are located between the second openings. The drain electrodes are respectively located in the first openings. The gate electrode comprises a first portion and a second portion connected to the first portion. The first portion is located in the second openings, and the second portion is disposed on the first portion and the protective layer. The source electrodes are respectively located in the third openings.

In conclusion, the semiconductor device of the present disclosure utilizes the gate electrode with a ring structure to increase the gate width, and thus the current output of the transistors is increased. Furthermore, the shortest distances between every sections of the gate electrode and the first electrode are substantially the same. The shortest distances between every sections of the gate electrode and the second electrode are substantially the same. Therefore, the invalid area on the substrate is decreased, and the manufacturing cost is also decreased.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
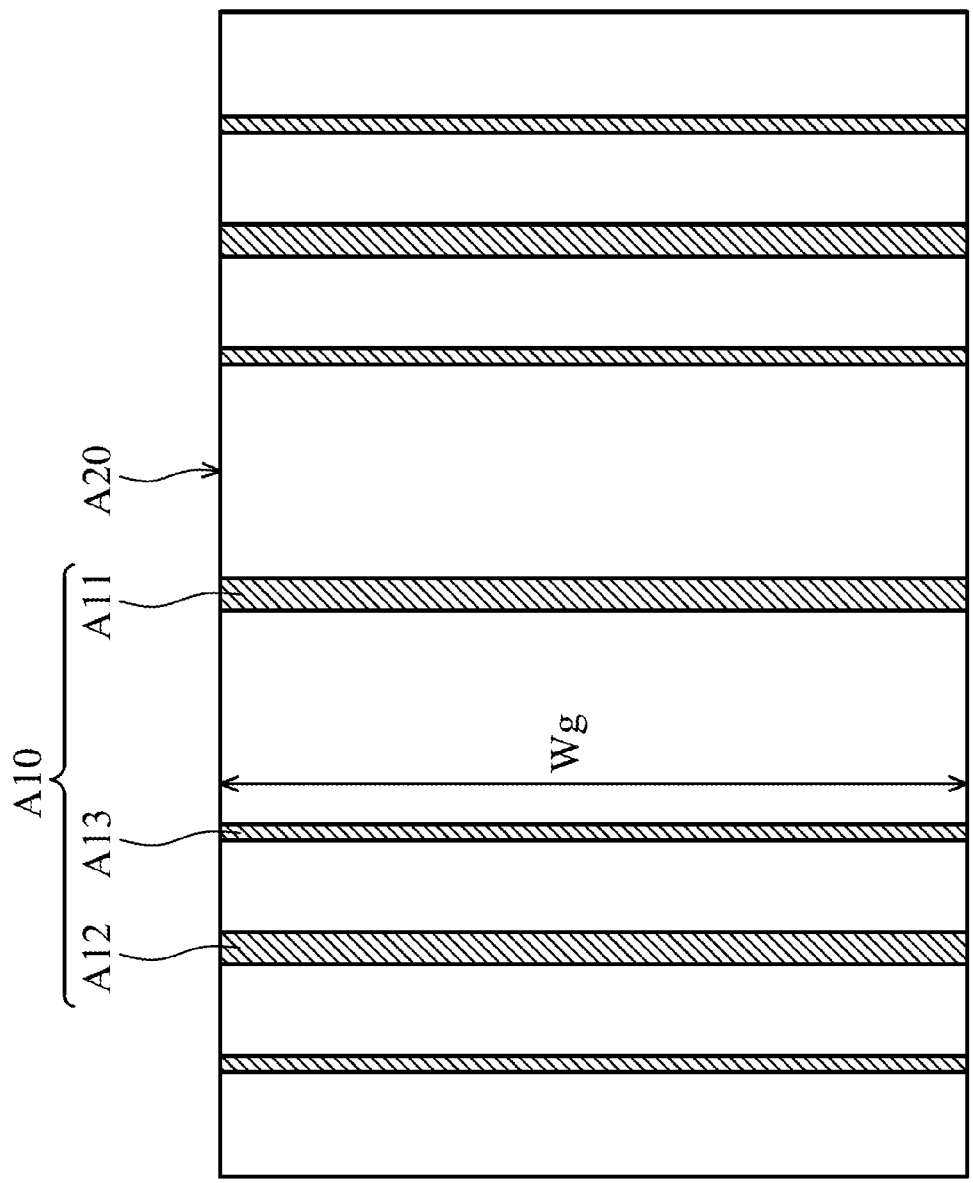
FIGS. 1 and 2 are schematic views of conventional field-effect transistors arranged on a substrate.
Figure 2:
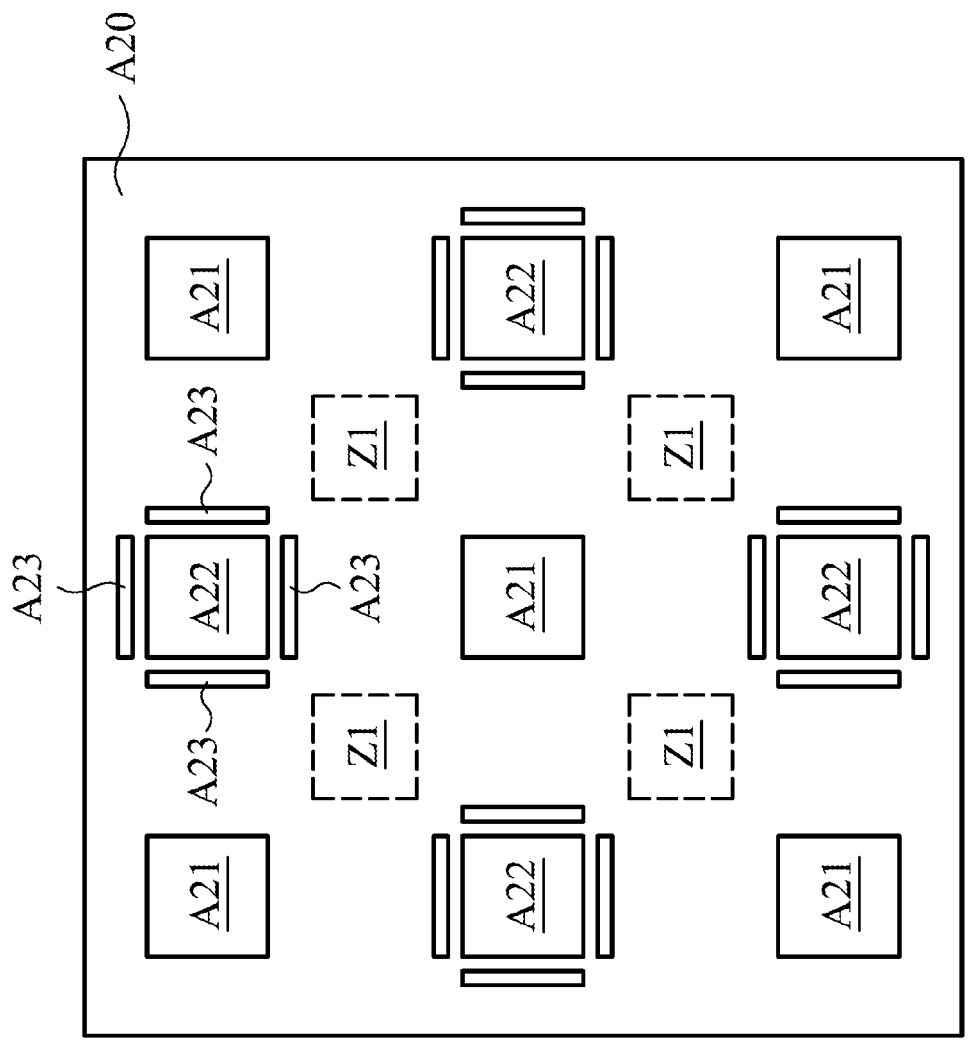
Figure 3:
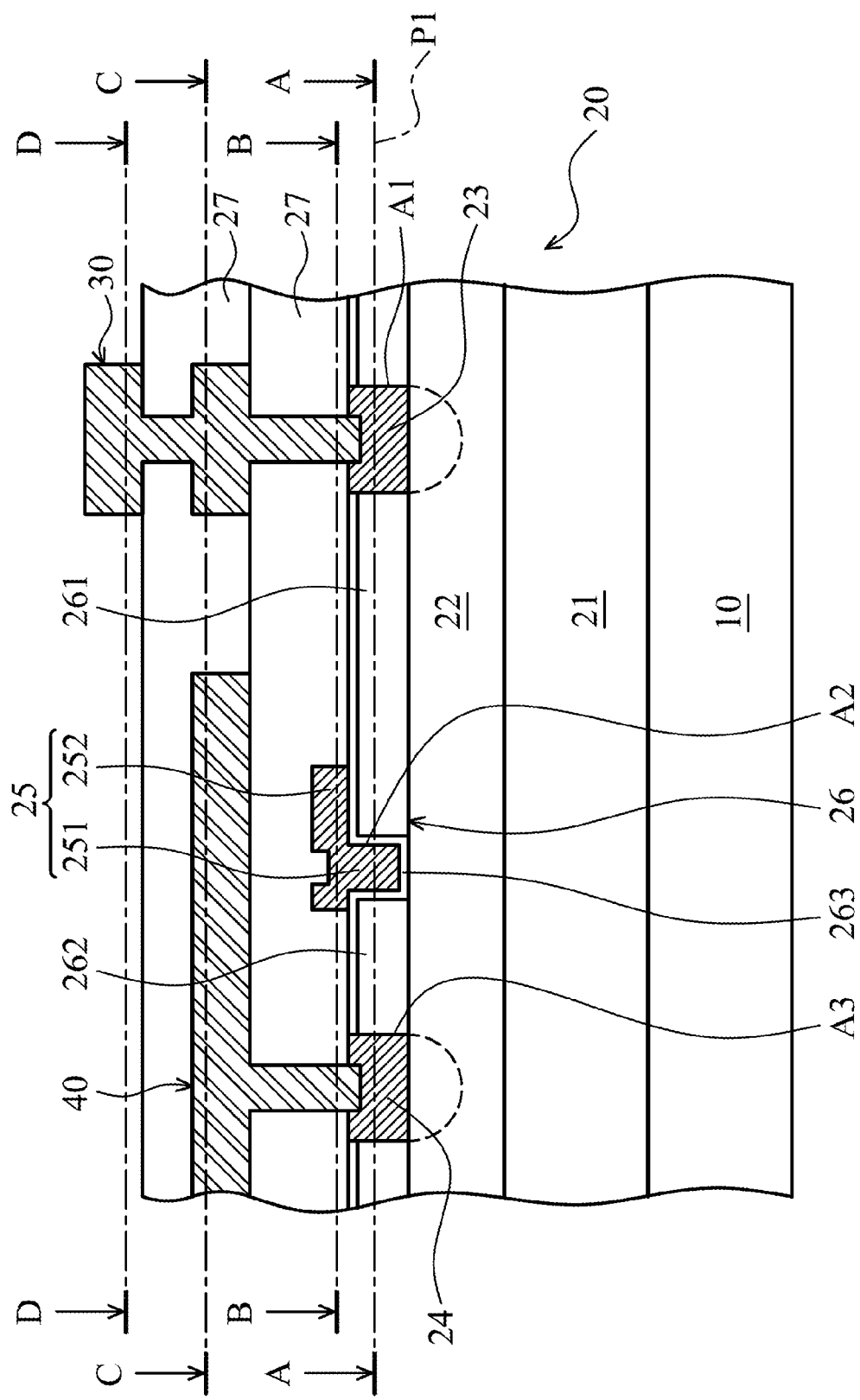
FIG. 3 is a cross-sectional view of the semiconductor device 1 according to the present disclosure.
Figure 4:
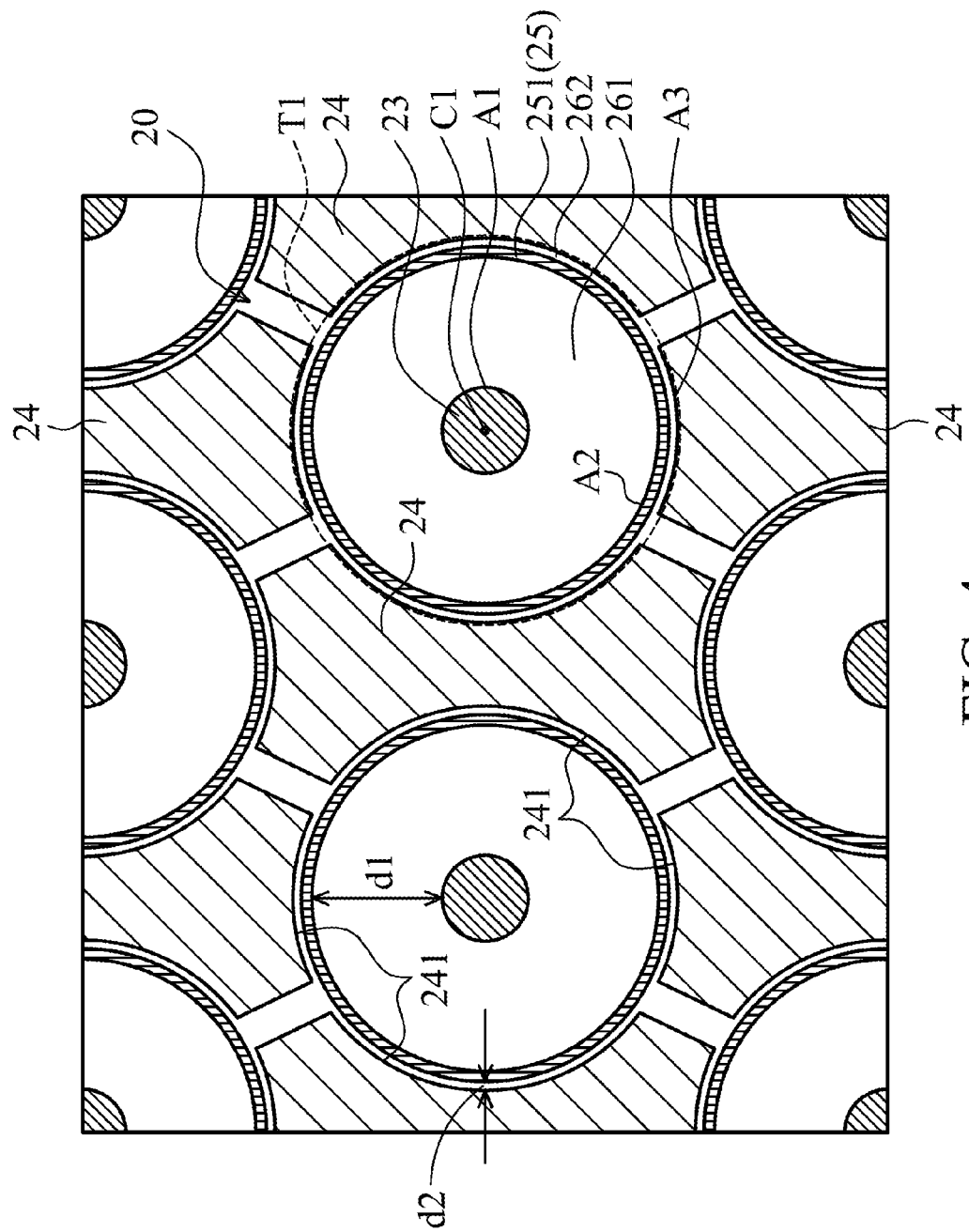
FIG. 4 is a cross-sectional view along the line AA of FIG. 3.

FIG. 3 is a cross-sectional view of the semiconductor device 1 according to the present disclosure. FIG. 4 is a cross-sectional view along the line AA of FIG. 3. The semiconductor device 1 is a switching device utilized in high power supplies.

The semiconductor device 1 includes a substrate 10, a plurality of transistors 20, a first conduction layer 30, and a second conduction layer 40. The substrate 10 may be a wafer made of silicon. The transistors 20 may be field-effect transistors (FETs) 20 formed on the substrate 10 and arranged on the substrate 10 in an array.

In some embodiments, the transistor 20 is a normally-on transistor including a buffer layer 21, an active layer 22, a first electrode 23, a second electrode 24, a gate electrode 25, a protective layer 26, and an insulation layer 27. The buffer layer 21 is disposed on substrate 10, and the active layer 22 is disposed on the buffer layer 21. In this embodiment, the buffer layer 21 is made of GaN or AlN. The active layer 22 includes a plurality of nitride-based semiconductor layers stacked on each other, and a conductive channel of high density 2-dimensional electric gas (2DEG). In some embodiments, the active layer 22 includes a gallium nitride layer and an aluminum gallium nitride layer disposed on the gallium nitride. The conductive channel of high density 2-dimensional electric gas (2DEG) is formed near the interface of the gallium nitride layer and the aluminum gallium nitride layer.

The protective layer 26 is disposed on the active layer 22, and has a plurality of first openings A1, a plurality of second openings A2 and a plurality of third openings A3. In some embodiments, the protective layer 26 is a silicon nitride layer formed on the active layer 22 by chemical vapor deposition (CVD). The first openings A1, the second openings A2 and the third openings A3 are formed on the protective layer 26 by etching process. The first openings A1 and the second openings A2 are arranged on the protective layer 26 in an array. The first openings A1 are circles or polygons. The polygons are at least pentagonal. Each of the second openings A2 is around one of the first openings A1. An edge of the second opening A2 facing the first opening A1 has a shape corresponding to that of the first openings A1. Each of the second openings A2 is located between one of the first openings A1 and some of the third openings A3. Each of the third openings A3 is located between the second openings A2. An edge of the third openings A3 facing to the second openings A2 has a shape corresponding to that of the second openings A2.

The protective layer 26 includes a first protective layer 261 and a second protective layer 262. The first protective layer 261 is located between the gate electrode 25 and the first electrode 23. The second protective layer 262 is located between the gate electrode 25 and the second electrode 24. In some embodiments, a third protective layer 263 with high density is formed in the second opening A2 as a gate insulation layer, to decrease the leakage current.

The first electrodes 23, the second electrodes 24, and the gate electrodes 25 are respectively disposed in the first openings A1, the third openings A3, and the second openings A2. The gate electrode 25 includes a first portion 251 and a second portion 252 connected to the first portion 251. The first portion 251 is disposed in the second opening A2. The second portion 252 is disposed on the first portion 251 and the protective layer 26. In some embodiments, the width of the second portion 252 of the gate electrode 25 exceeds that of the first portion 251. The second opening A2 is extended toward the first opening A1 therein to disperse the electric field and improve the breakdown voltage of semiconductor devices. In this embodiment, the first electrode 23 is a drain electrode, and the second electrode 24 is a source electrode. However, in another embodiment, the first electrode 23 is a source electrode, and the second electrode 24 is a drain electrode.

The insulation layer 27 is disposed on the protective layer 26, the first electrode 23, the second electrode 24, and the gate electrode 25. The first conduction layer 30 passes through the insulation layer 27, and connects to the first electrode 23. The second conduction layer 40 passes through the insulation layer 27, and connects to the second electrode 24.

Figure 5:
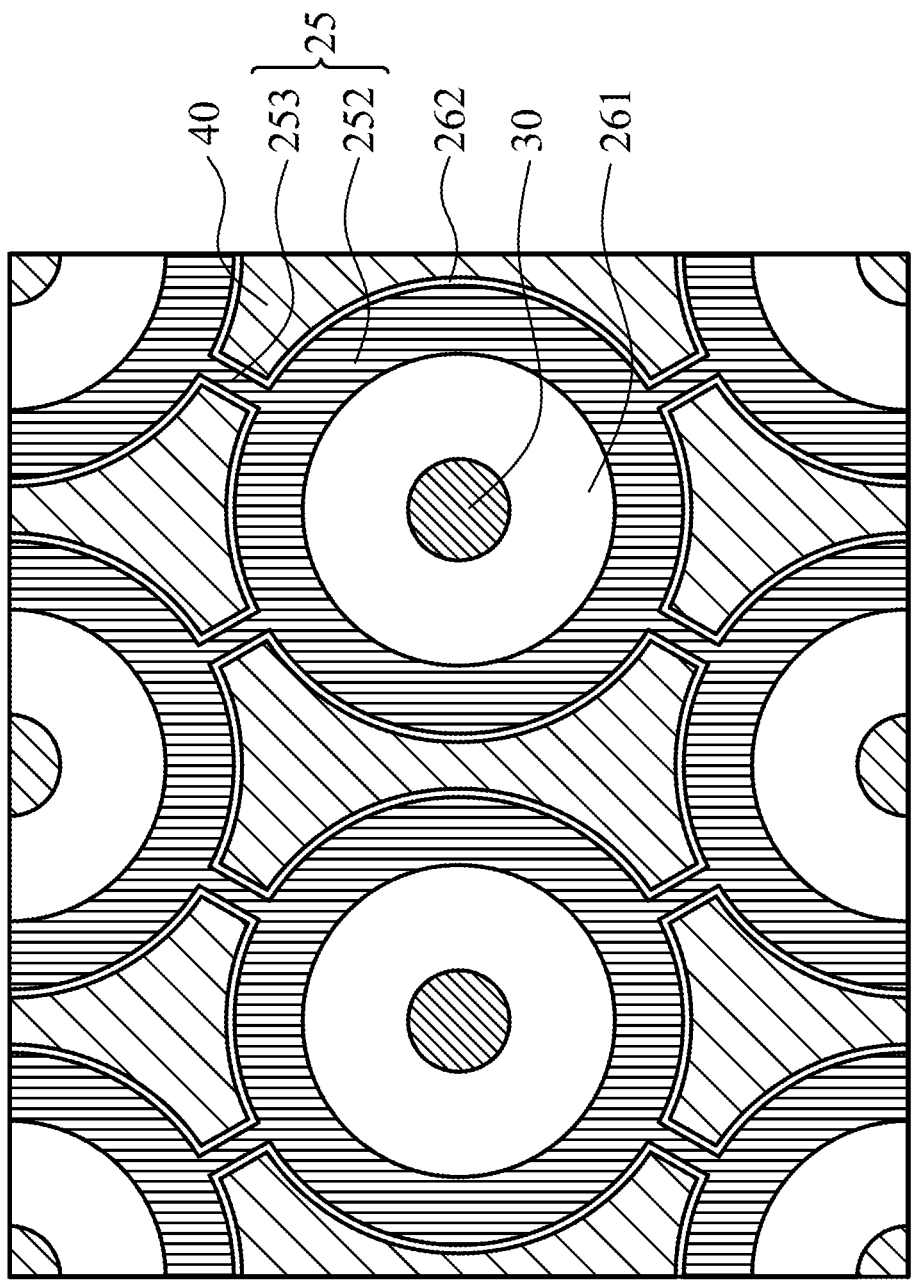
FIG. 5 is a cross-sectional view along the line BB of FIG. 3.
Figure 6:
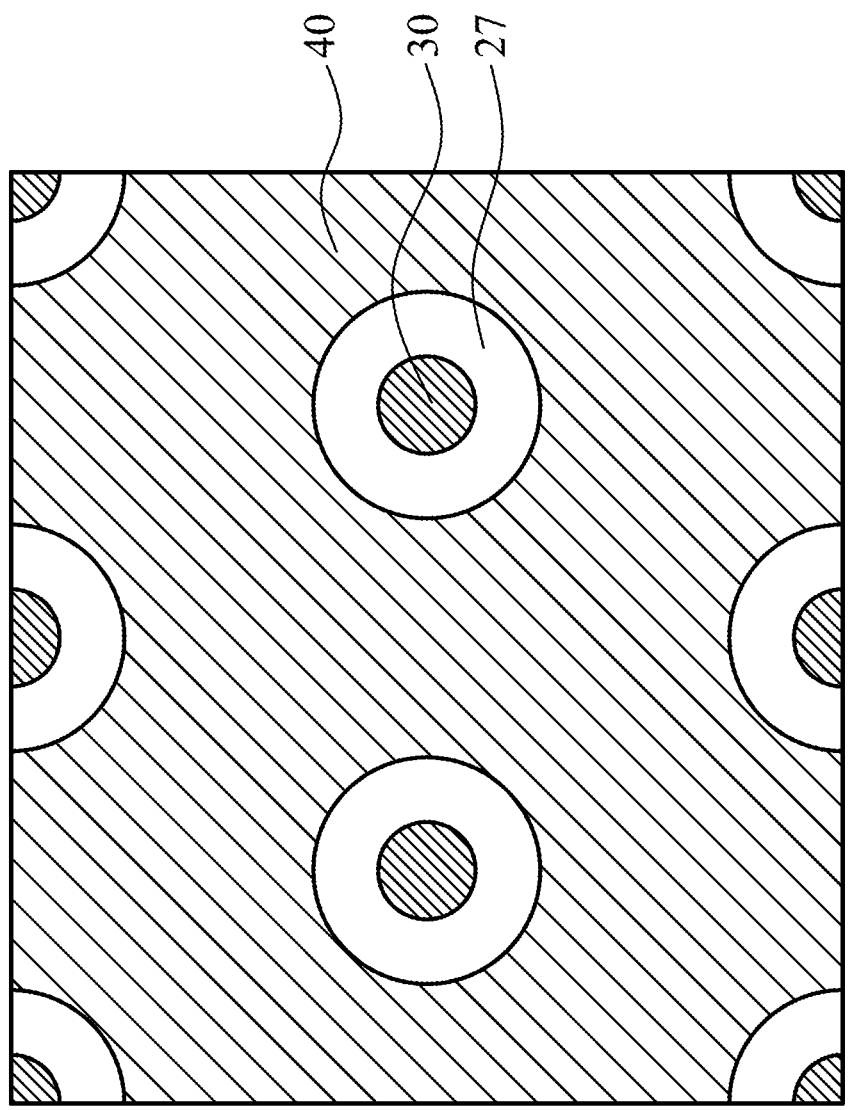
FIG. 6 is a cross-sectional view along the line CC of FIG. 3.
Figure 7:
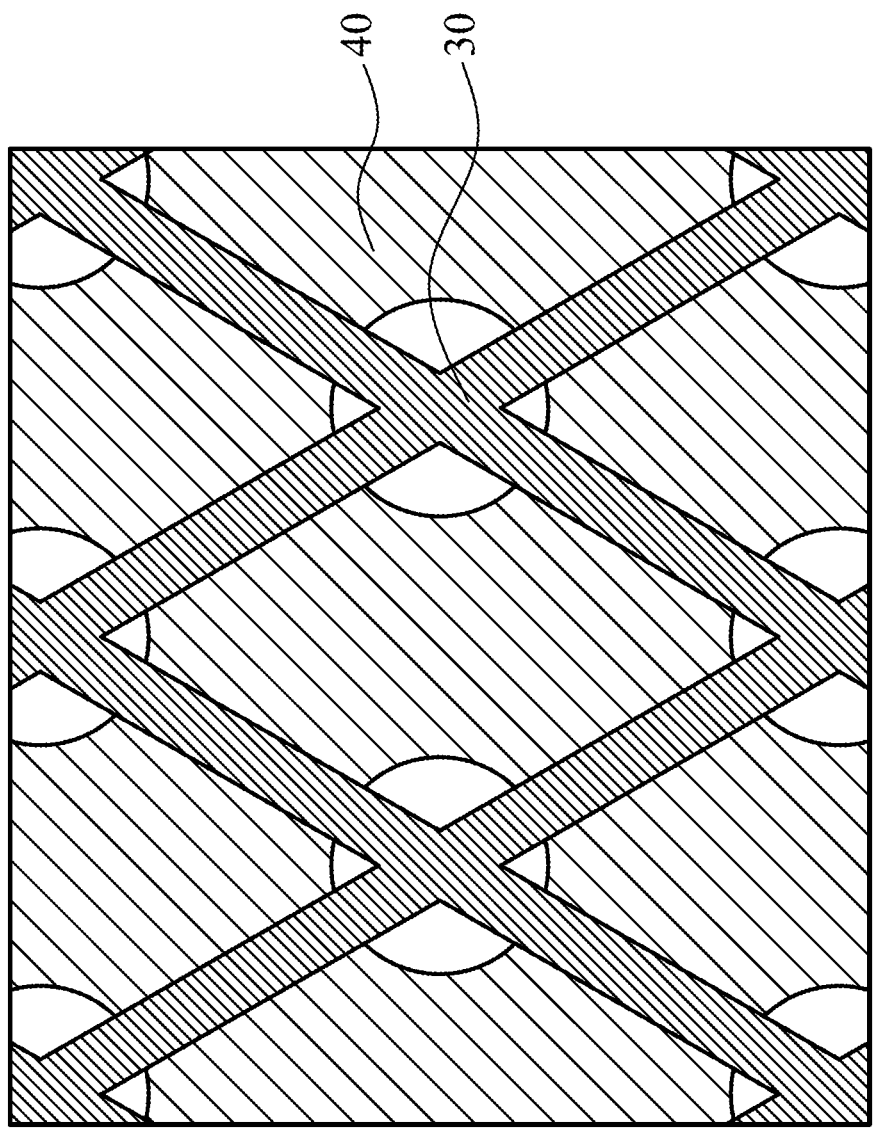
FIG. 7 is a cross-sectional view along the line DD of FIG. 3.

FIG. 5 is a cross-sectional view along the line BB of FIG. 3. FIG. 6 is a cross-sectional view along the line CC of FIG. 3. FIG. 7 is a cross-sectional view along the line DD of FIG. 3. Referring to the BB cross-section as shown in FIGS. 3 and 5, the gate electrode 25 further includes a plurality of elongated connecting portions 253 connected to two adjacent second portions 252. Therefore, the first portions 251 and the second portions 252 located at different second openings A2 are electrically connected to each other.

Referring to the CC cross-section as shown in FIGS. 3 and 6, a plurality of first conduction layers 30 and the insulation layers 27 are arranged in an array. The insulation layer 27 is a ring structure located between the first conduction layer 30 and the second conduction layer 40. Moreover, the second conduction layer 40 is a mesh structure to electrically connect each of the second electrodes 24.

Referring to the DD cross-section as shown in FIGS. 3 and 7, the insulation layer 27 is omitted for clarity. The first conduction layer 30 is a mesh structure to electrically connect each of the first electrodes 23.

Figure 8:
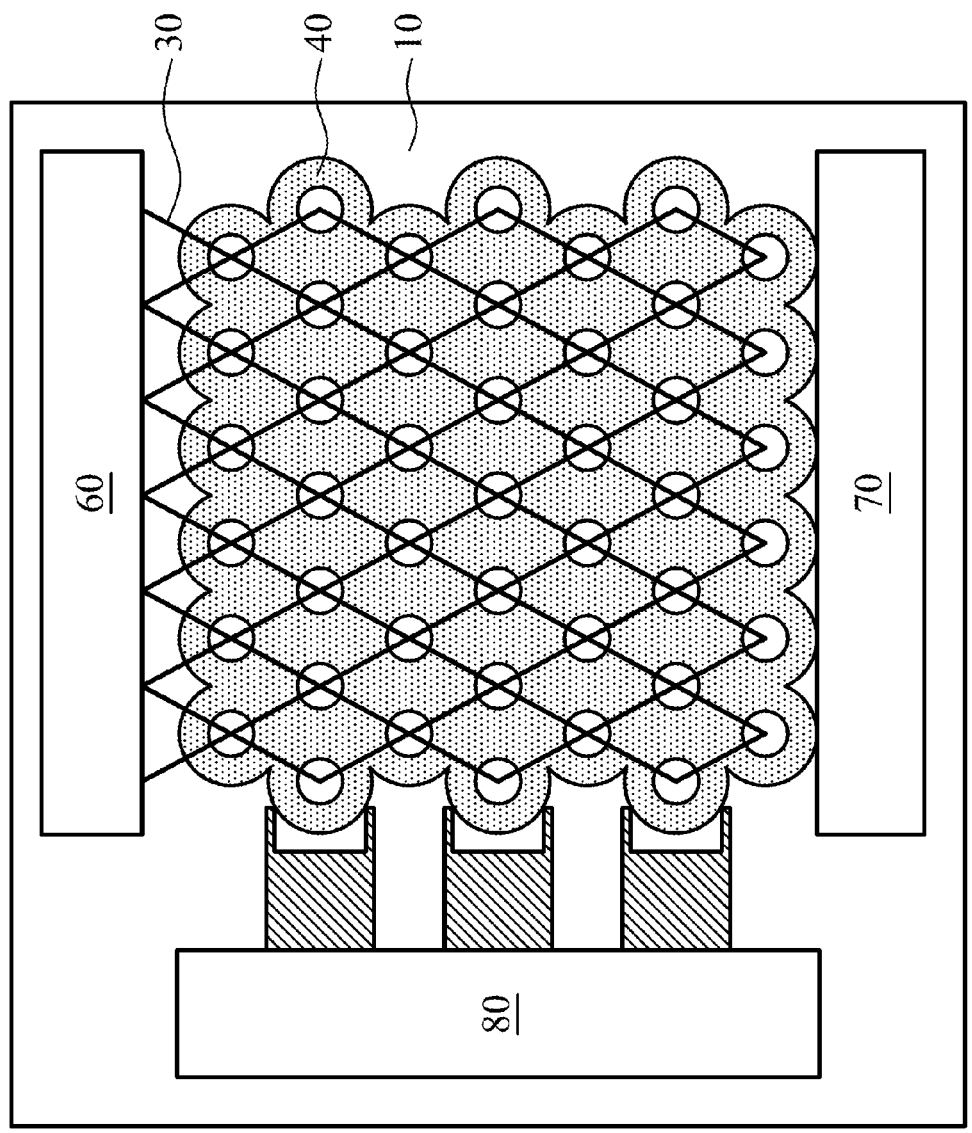
FIG. 8 is a top view of the semiconductor device according to the present disclosure.

FIG. 8 is a top view of the semiconductor device 1 according to the present disclosure. The semiconductor device 1 further includes a first pad 60, a second pad 70, and a gate pad 80. The first pad 60, the second pad 70, and the gate pad 80 are disposed on the substrate 10. The first pad 60 is connected to the first conduction layer 30, the second pad 70 is connected to the second conduction layer 40, and the gate pad 80 is connected to the gate electrode 25. Therefore, in this embodiment, the transistors 20 of the semiconductor device 1 are connected in parallel to provide greater current.

Moreover, the first conduction layer 30, the second conduction layer 40 and the gate electrode 25 form a mesh structure, and thus have a greater area. Therefore, the resistance of the first conduction layer 30 and the second conduction layer 40 are decreased, the outputting resistance of the semiconductor device 1 is decreased, and the performance of the semiconductor device 1 is improved.

In this embodiment, the field-effect transistors 20 of the semiconductor device 1 may be applied to a high-voltage power supply. The shortest distance between the drain electrode and the source electrode is greater than 7 um, or between 7 um and 30 um. The voltage provided by the high-voltage power supply exceeds 300 V.

As shown in FIG. 4, the gate electrode 25, the first protective layer 261, and the second protective layer 262 are ring structures. The second electrodes 24 are around the gate electrode 25. The first electrode 23 and an edge of the gate electrode 25 facing the first electrode 23 are circular, and have the same circle center C1. The edge 241 of the second electrode 24 facing to the gate electrode 25 has a shape corresponding to that of the gate electrode 25. In the embodiment, the edge 241 of the second electrode 24 is a circular arc extending along a circular path T1, and arranged as a ring shape. The circular path T1 and the first electrode 23 have the same circle center C1. The distance d1 between the first electrode 23 and the gate electrode 25 is at least three times greater than the distance d2 between the second electrode 24 and the gate electrode 25.

According to the described structure, the shortest distances between any one section of the gate electrode 25 and the first electrode 23 are substantially the same. Further, the shortest distances between any one section of the gate electrode 25 and the second electrode 24 are substantially the same. Therefore, the current flows uniformly through the area between the first electrode 23 and the second electrode 24. Further, the invalid area on the substrate 10 is greatly decreased, and the area utilization of the substrate 10 is improved. The semiconductor device 1 can be fabricated with a smaller substrate 10, and the manufacturing cost is decreased.

In this embodiment, the first electrode 23, the second electrode 24, and the gate electrode 25 are arranged on the substrate 10 in an array. Moreover, the gate electrode 25 is a ring structure, the gate electrode 25 is around the first electrode 23, and the second electrode 24 is around the gate electrode 25. Therefore, according to the described structure, the gate width of the gate electrode 25 is greater at the same substrate 10.

Figure 9:
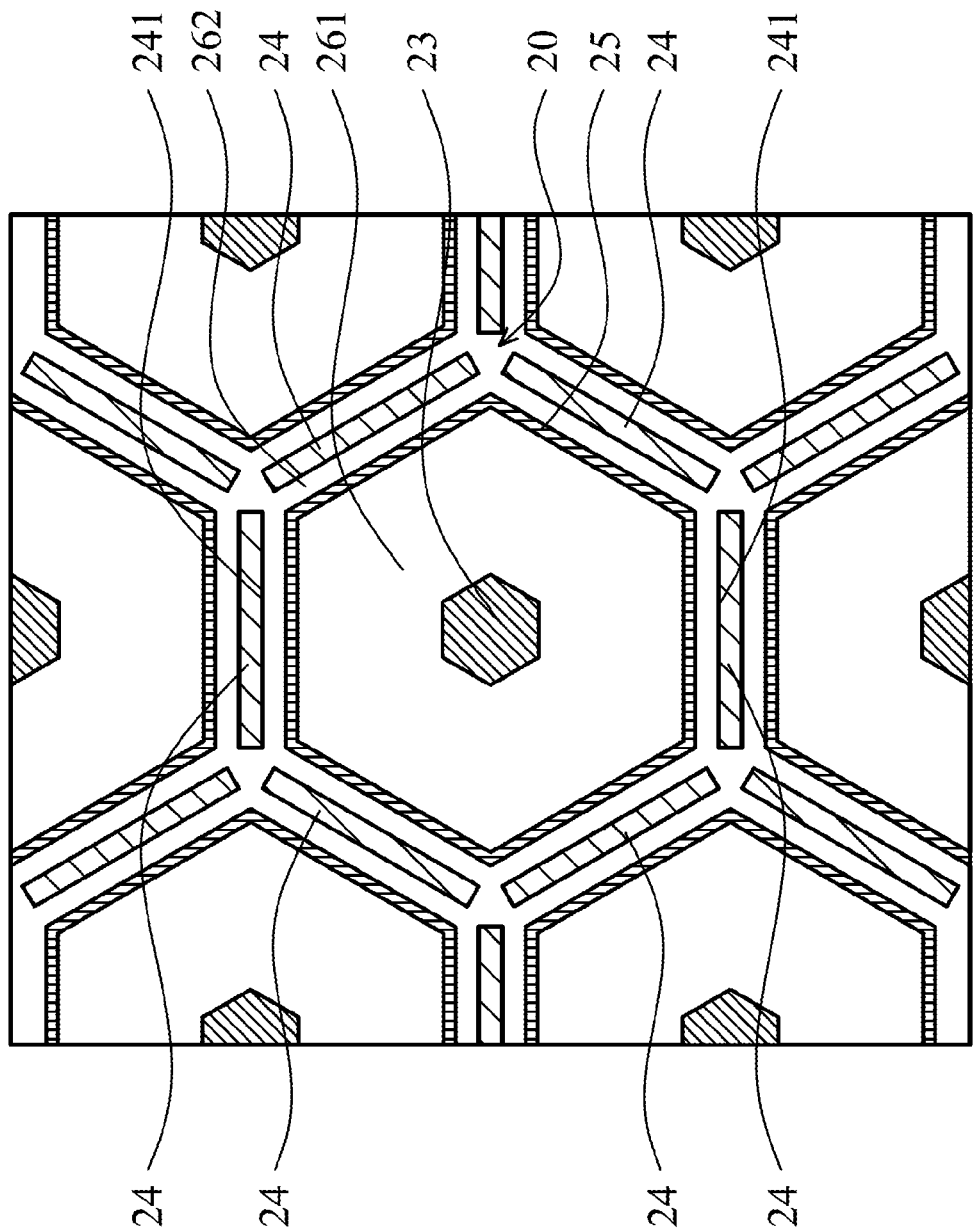
FIGS. 9 to 12 are cross-sectional views of the semiconductor device 1 of another embodiment according to the present disclosure.
Figure 10:
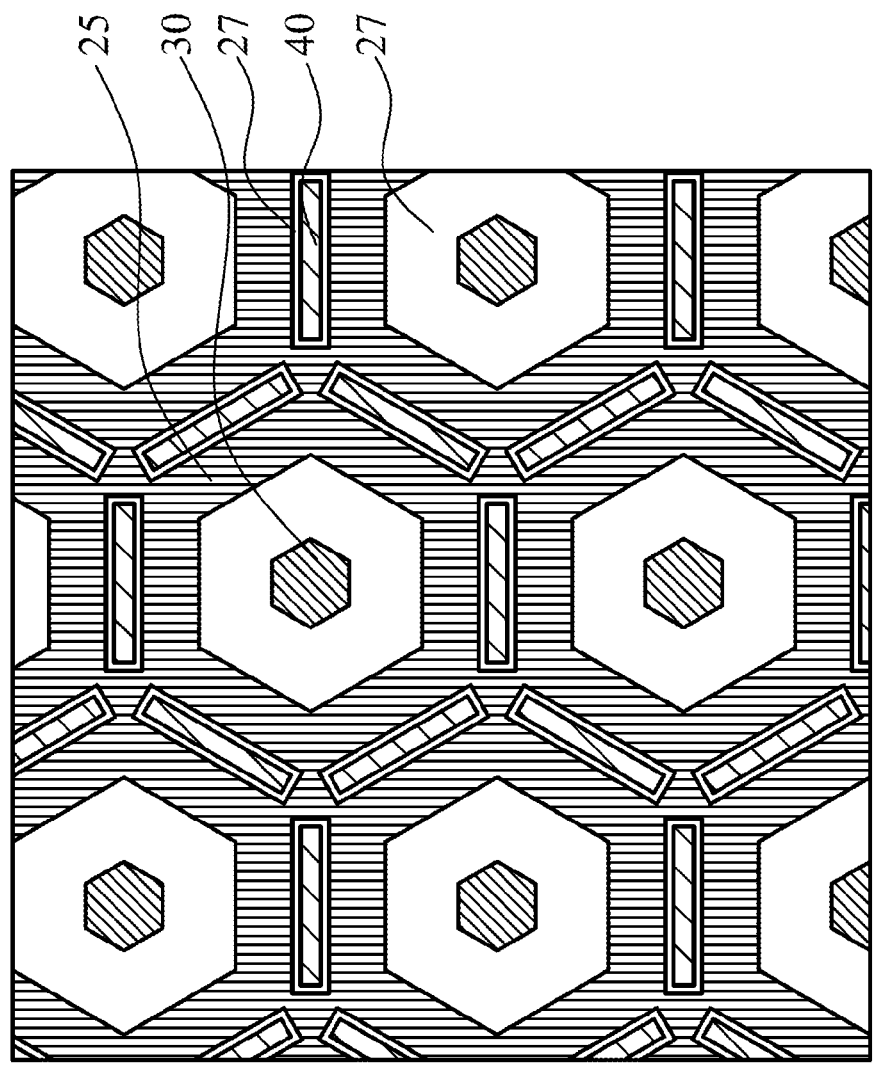
Figure 11:
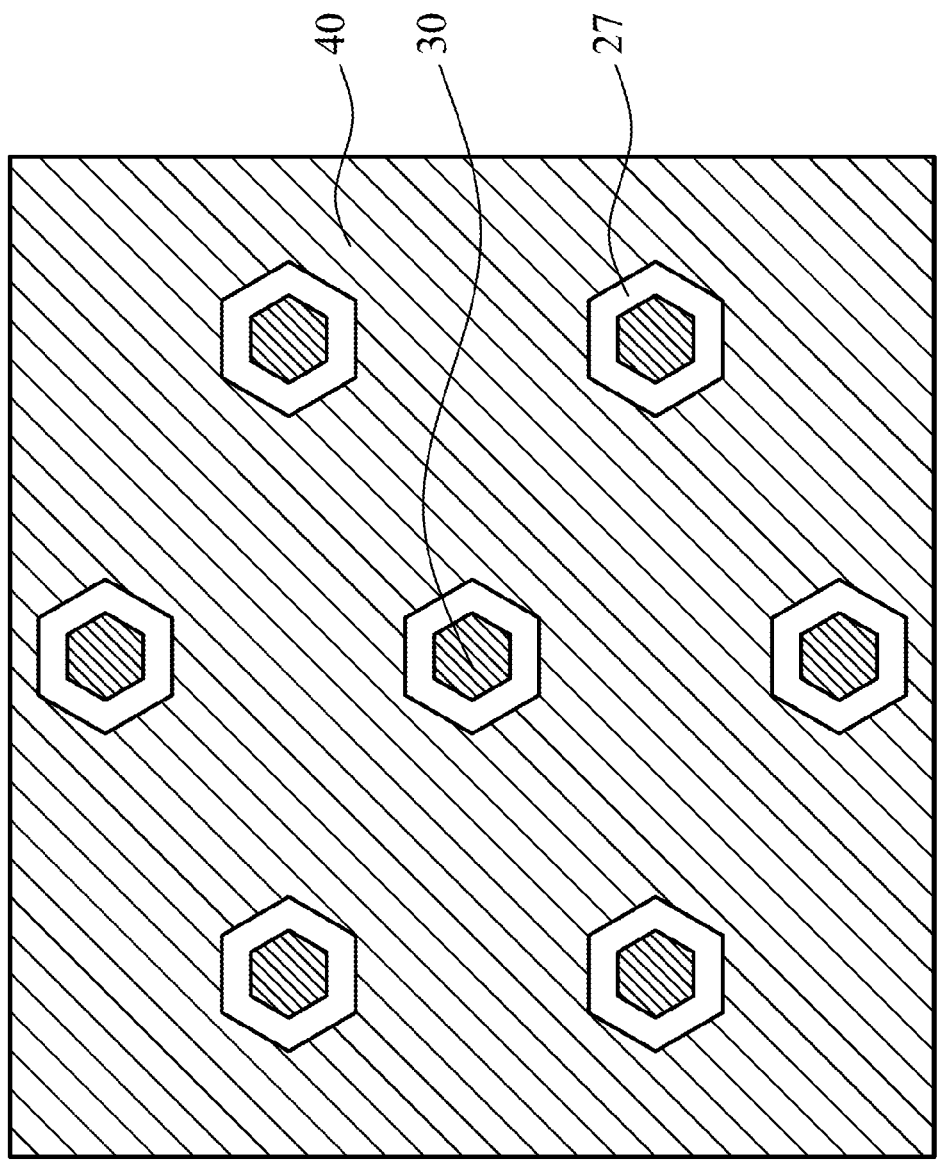
Figure 12:
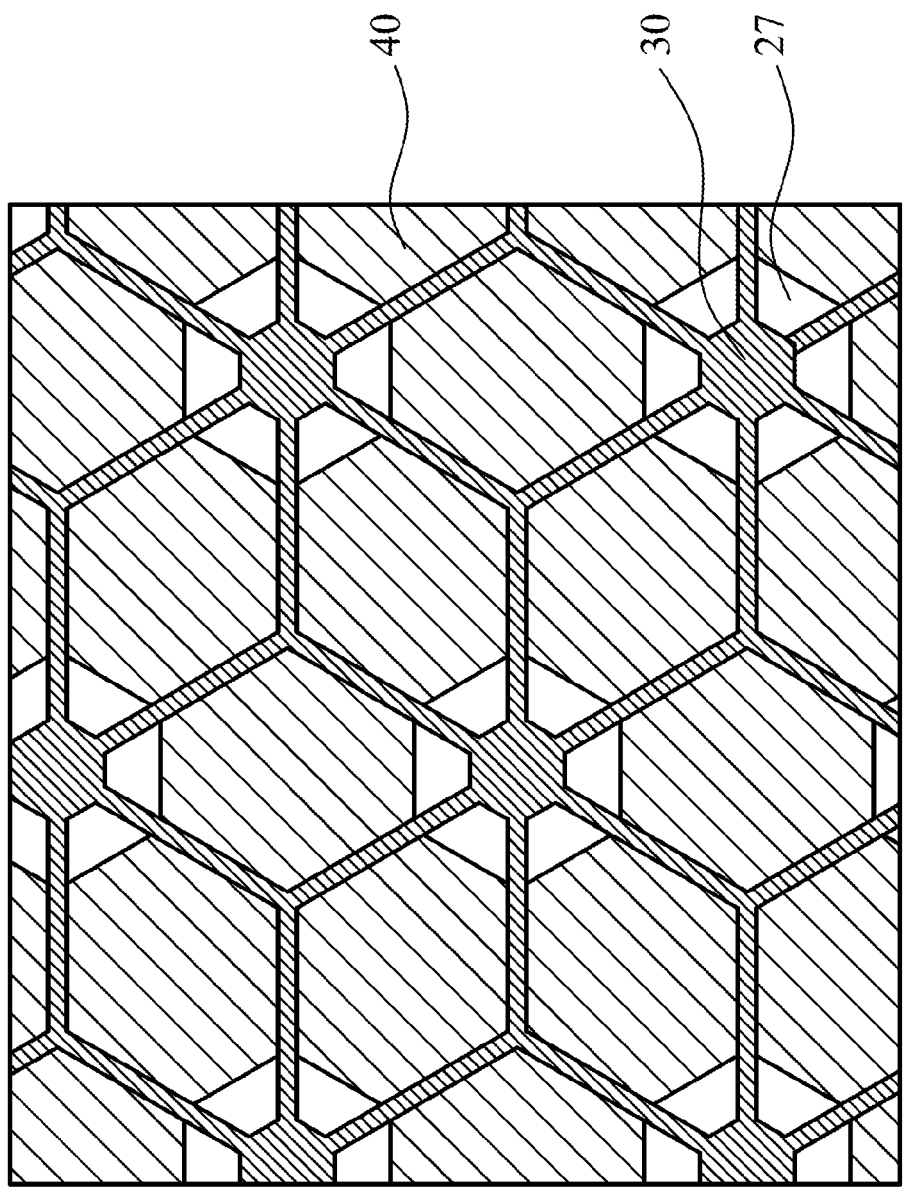

FIGS. 9 to 12 are cross-sectional views of the semiconductor device 1 of another embodiment according to the present disclosure. The location of the cross section in FIG. 9 is referring to the cross section along the line AA in FIG. 3. The location of the cross section in FIG. 10 is referring to the cross section along the line BB in FIG. 3. The location of the cross section in FIG. 11 is referring to the cross section along the line CC in FIG. 3. The location of the cross section in FIG. 12 is referring to the cross section along the line DD in FIG. 3. In this embodiment, the first electrode 23 and an edge of the gate electrode 25 facing the first electrode 23 are regular polygons having the same center. The first electrode 23, the gate electrode 25, the first protective layer 261, and the second protective layer 262 are polygons or regular polygons, having the same center. In this embodiment, the polygon is a regular hexagon. The edge 241 of the second electrode 24 facing the gate electrode 25 has a shape corresponding to that of the gate electrode 25. In the embodiment, the edges 241 of the second electrodes 24 are straight lines and annularly arranged. In some embodiments, the shape of the first electrode 23 is a polygon (or a convex polygon), and the ratio of the shortest side to the longest side of the first electrode 23 is greater than 0.7.

In another embodiment, the polygon is a pentagon, a hexagon, an octagon, a dodecagon, or at least an icosagon. For example, the polygon is a pentagon, a hexagon, octagon, a dodecagon, or an icosagon. In some embodiments, the regular polygon is a regular pentagon, a regular hexagon, a regular octagon, a regular dodecagon, or at least a regular icosagon. For example, the polygon is a regular pentagon, a regular hexagon, a regular octagon, a regular dodecagon, or a regular icosagon.

Referring to the cross section along the line BB as shown in FIGS. 3 and 10, the gate electrode 25 is formed as a mesh structure, to electrically connect the first portions 251 in different second openings A2. The first conduction layer 30 and the second conduction layer 40 are spaced by the insulation layer 27.

Referring to the cross section along the line CC as shown in FIGS. 3 and 11, a plurality of first conduction layers 30 and insulation layers 27 are arranged in an array. The insulation layer 27 is a ring structure located between the first conduction layer 30 and the second conduction layer 40. Moreover, the second conduction layer 40 is formed as a mesh structure to electrically connect each of the second electrodes 24.

Referring the cross section along the DD line as shown in FIGS. 3 and 12, the insulation layer 27 at the cross section is omitted for clarity. The first conduction layer 30 is formed as a mesh structure to electrically connect each of the first electrodes 23.

In conclusion, the semiconductor device of the present disclosure utilizes the gate electrode with ring structure to increase the gate width, and thus the output current of the transistors are increased. Further, the shortest distances between any one section of the gate electrode and the first electrode are substantially the same. The shortest distances between any one section of the gate electrode and the second electrode are substantially the same. Therefore, the invalid area on the substrate is decreased, and the manufacturing cost is also decreased.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a substrate;
    an active layer, disposed on the substrate;
    a protective layer, disposed on the active layer, having a plurality of first openings, a plurality of second openings, and a plurality of third openings, wherein each of the first openings is a polygon, and the polygon is at least pentagonal, each of the second openings is around one of the first openings, an edge of each of the second openings facing the first opening therein has a shape corresponding to that of the first opening, and the third openings are located between the second openings;
    a plurality of drain electrodes respectively located in the first openings;
    a gate electrode comprising a first portion and a second portion connected to the first portion, wherein the first portion is located in the second openings, and the second portion is disposed on the first portion and the protective layer; and
    a plurality of source electrodes respectively located in the third openings.

2. The semiconductor device as claimed in claim 1, wherein the first opening is arranged in an array, each of the second openings is located between one of the first openings and some of the third openings.

3. The semiconductor device as claimed in claim 1, further comprising an insulation layer disposed on the protective layer, the gate electrode, the source electrodes and the drain electrodes.

4. The semiconductor device as claimed in claim 1, further comprising a first conduction layer connected to one of the drain electrodes, and a second conduction layer connected to the source electrodes.

5. The semiconductor device as claimed in claim 1, wherein edges of the third openings facing the second openings correspond to the shape of the second openings.

* * * * *